United States Patent
Su et al.

(10) Patent No.: US 8,450,748 B2
(45) Date of Patent: May 28, 2013

(54) SOLID STATE LIGHT EMITTING DEVICE

(75) Inventors: Hwa Su, Taipei (TW); Hsi-Yan Chou, Taipei (TW); Yu-Min Li, Zhongli (TW); Yu-Chou Hu, Mingjian Township (TW); Chih Wei Huang, Linyuan Township (TW); Tzu-Chi Cheng, Taoyuan (TW)

(73) Assignee: InterLight Optotech Corporation, Taoyuang (TW)

( * ) Notice: Subject to any disclaimer, the term of this patent is extended or adjusted under 35 U.S.C. 154(b) by 152 days.

(21) Appl. No.: 12/832,377

(22) Filed: Jul. 8, 2010

(65) Prior Publication Data

US 2011/0180804 A1   Jul. 28, 2011

(30) Foreign Application Priority Data

Dec. 29, 2009  (JP) ................................ 2009-299148
Jan. 26, 2010  (EP) ................................... 10151638

(51) Int. Cl.
*H01L 33/08* (2010.01)
*H01L 27/15* (2006.01)
*H01L 33/30* (2010.01)

(52) U.S. Cl.
USPC ............ 257/76; 257/88; 257/89; 257/E27.12; 257/E33.023

(58) Field of Classification Search
USPC ................... 257/76, 88, 89, E27.12, E33.023
See application file for complete search history.

(56) References Cited

U.S. PATENT DOCUMENTS

| | | | |
|---|---|---|---|
| 4,182,977 A | 1/1980 | Stricklin, Jr. | |
| 5,998,925 A | 12/1999 | Shimizu | |
| 6,957,899 B2 | 10/2005 | Jiang | |
| 7,213,940 B1 * | 5/2007 | Van De Ven et al. | ......... 362/231 |
| 7,311,858 B2 | 12/2007 | Wang | |
| 7,390,437 B2 | 6/2008 | Dong | |
| 7,575,697 B2 | 8/2009 | Li | |
| 7,601,276 B2 | 10/2009 | Li | |
| 7,906,789 B2 * | 3/2011 | Jung et al. | ........................ 257/89 |
| 8,054,002 B2 * | 11/2011 | Lee et al. | ...................... 315/291 |
| 2006/0012989 A1 | 1/2006 | Lee | |
| 2006/0158090 A1 | 7/2006 | Wang et al. | |
| 2007/0029526 A1 | 2/2007 | Cheng et al. | |
| 2007/0120496 A1 | 5/2007 | Shimizu et al. | |

(Continued)

FOREIGN PATENT DOCUMENTS

EP       1874097 A1   1/2008
KR   1020060094150 A   8/2006

(Continued)

*Primary Examiner* — Dao H Nguyen
(74) *Attorney, Agent, or Firm* — CKC & Partners Co., Ltd.

(57) ABSTRACT

A light emitting device comprises: an LED chip array comprising a plurality of LEDs formed on a single die (monolithic chip array) and at least one discrete LED that is separate from the LED chip array connected in series with the LED chip array. In an AC-drivable device the LED chip array is AC-drivable and two or more discrete LEDs are configured to be AC-drivable. The device can further comprise a package in which the LED chip array and discrete LED(s) are mounted. The discrete LEDs are configured such that positive and negative half wave periods of an AC drive voltage are mapped onto oppositely connected LED such that oppositely connected LED chips are alternately operable on a respective half wave period.

29 Claims, 19 Drawing Sheets

U.S. PATENT DOCUMENTS

| | | | |
|---|---|---|---|
| 2007/0131942 A1* | 6/2007 | Yen et al. | 257/79 |
| 2007/0200512 A1 | 8/2007 | Gotou et al. | |
| 2008/0083929 A1 | 4/2008 | Fan et al. | |
| 2008/0111472 A1 | 5/2008 | Liu et al. | |
| 2008/0211416 A1* | 9/2008 | Negley et al. | 315/193 |
| 2008/0218098 A1 | 9/2008 | Lee et al. | |
| 2009/0283721 A1 | 11/2009 | Liu et al. | |
| 2011/0031891 A1* | 2/2011 | Lee et al. | 315/250 |

FOREIGN PATENT DOCUMENTS

| | | |
|---|---|---|
| KR | 1020070066999 A | 6/2007 |
| KR | 1020080097850 A | 11/2008 |
| TW | 200826320 | 6/2008 |
| WO | 99/20085 A1 | 4/1999 |
| WO | 2007/023454 A1 | 3/2007 |

\* cited by examiner

SOLID STATE LIGHT EMITTING DEVICE

BACKGROUND OF THE INVENTION

1. Field of the Invention

This invention relates to solid state light emitting devices and in particular to light emitting devices based on LEDs (light emitting diodes). More particularly, although not exclusively, the invention concerns light emitting devices that are operable from high voltage (typically 110 or 220V) power sources. Moreover the invention concerns AC-drivable light emitting devices that generate white light with a CRI (Color Rendering Index) of at least 90.

2. Description of the Related Art

White light generating LEDs, "white LEDs", are a relatively recent innovation and offer the potential for a whole new generation of energy efficient lighting systems to come into existence. It is predicted that white LEDs could replace incandescent, fluorescent and compact fluorescent light sources due to their long operating lifetimes, potentially many 100,000 of hours, and their high efficiency in terms of low power consumption. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light or yellow and red light. The portion of the blue light generated by the LED that is not absorbed by the phosphor is combined with the light emitted by the phosphor to provide light which appears to the human eye as being nearly white in color.

Since LEDs are intrinsically direct current (DC) devices and will only pass an electrical current in a single direction they have typically been driven by low voltage (e.g. 3.5V for gallium nitride (GaN) LEDs) DC sources.

However in lighting applications it is desirable to be able to operate white LEDs directly from a high voltage (110/220V) AC mains power supply without the need for expensive power supplies and driver circuitry.

U.S. Pat. No. 6,957,899 to Jiang et al. disclose a single-chip integrated LED 1 that is for direct use with a high voltage (110V/220V) AC power source. The LED 1 comprises a plurality of series-connected LEDs arranged in two strings (arrays) 14, 18 (FIG. 1). The strings 14, 18 are connected in parallel with the LEDs in opposite polarity in a half-wave rectifier configuration such that the LEDs are self-rectifying. A sufficient number of LEDs (e.g. twenty eight per string for 110V operation and fifty five per string for 220V operation) is provided in each string to drop the total source voltage across the LEDs. During the positive half of the AC cycle one string of LEDs is forward biased and energized, while the other string is reverse biased. During the negative half of the AC cycle, the other string of LEDs is forward biased and energized, while the first string is reverse biased and not energized. Thus the strings are alternately energized at the frequency of the AC supply (50-60 Hz) and the single-chip LED appears to be constantly energized. The single-chip LED is formed by epitaxially depositing layers of n-type semiconductor material, optically active layers and p-type semiconductor material in succession to define individual LEDs on a single wafer. Adjacent LEDs are interconnected by depositing conducting layers between individual LEDs. Although such a fabrication is compact it has a disadvantage that since only one LED string is energized at a time the arrangement has only a 50% payload.

At present, the yield rate of GaN (gallium nitride) LED chips is unable to guarantee a uniform brightness or a 100% light emitting efficiency of each LED chip causing a non-uniform light emission. Additionally if there is a surge in the drive voltage the LED chips in the light emitting device can be burned out, and the reliability can become an issue.

As shown in FIG. 2, Taiwanese Patent Application Publication No. 200826320, to Lin et al., teach an AC-drivable light emitting device that includes at least one correction circuit 20 that operates as a temperature and voltage compensation circuit. In operation the correction circuit absorbs power surges to protect the light emitting diode 21.

United States patent application Publication No. US 2008/083929, to Fan et al., disclose a high voltage AC/DC drivable LED device with an integrated protection mechanism. FIG. 3 is a schematic cross-sectional view of the device and shows a monolithically integrated current-limiting resistor 30 on the LED chip. Whilst the current limiting resistor provides protection to the device it dissipates energy in the form of heat generation reducing the overall luminous efficacy of the device.

United States patent application Publication No. US 2008/218098, to Lee et al., teach a light emitting device with a monolithically integrated bridge rectifying circuit. FIG. 4 is a schematic plan view of the light emitting device of Lee et al. showing integration of the bridge rectifying circuit 40 around the peripheral edges of an array of serially-connected LEDs 41. It is claimed that the rectifying circuit 40, which is composed of diodes, improves reliability of operation the device and luminance. However, since the bridge rectifying circuit 40 is directly formed on the LED substrate it is not possible to produce LEDs with different light emission wavelengths on the same substrate and such a device still has the drawback that the diodes of the rectifier circuit dissipate energy without contributing to light emission of the device.

A need exists for high voltage drivable solid state light emitting devices that in part at least overcome the limitations of the known devices.

SUMMARY OF THE INVENTION

Embodiments of the invention are directed to light emitting devices that are operable directly from a high drive voltage sources typically 40, 110, 220 or 240V. The device comprises an array of LEDs formed on a single die (monolithic LED chip array) having a nominal drive voltage. To compensate for variations between the nominal and actual drive voltage of the LED chip array arising during production of the chip array, the device of the invention further comprises one or more discrete LEDs (i.e. not formed as a part of the LED chip array) connected in series with the LED array. The number of discrete LEDs is selected to prevent overdriving of the LED chip array when the device is operated at the nominal drive voltage. Devices in accordance with the invention provide the advantage that the discrete LED(s) in addition to ensuring an appropriate drive voltage for the LED chip array also contribute to the light emission of the device.

According to the invention a light emitting device comprises: an LED chip array comprising a plurality of LEDs formed on a single die and at least one discrete LED that is separate from the LED chip array connected in series with the LED chip array. The device can further comprise a package or lead frame in which the LED chip array and discrete LED(s) are housed.

The device can be configured to be AC-drivable or DC-drivable. Typically the discrete LED(s) is/are connected in series with the LED chip array in a voltage divider configuration to provide overvoltage protection to the LED chip array.

In AC-drivable devices the LED chip array and a plurality of discrete LED(s) are each configured to be AC-drivable. In one arrangement the discrete LEDs are configured such that positive and negative half wave periods of an AC drive voltage are mapped onto oppositely connected LEDs such that oppositely connected LEDs are alternately operable on a respective half wave period. In one arrangement at least two discrete LEDs are connected in parallel in opposite polarity. Alternatively the discrete LEDs can be connected in a bridge configuration.

The LED chip array and discrete LED(s) can be operable to emit light of substantially the same wavelength. Alternatively the LED chip array and the LEDs are operable to emit light of different wavelengths. Typically the LED chip array is operable to emit blue light having a peak wavelength in a range 455 nm to 460 nm. The discrete LEDs can be operable to emit blue light having a peak wavelength in a range 490 nm to 510 nm. In applications where it is required that the device generate white light having a CRI of 90 or higher the discrete LEDs advantageously comprise red LEDs that are operable to generate red light having a peak wavelength in a range 620 nm to 670 nm.

In many applications a white light emission product is required and the device advantageously further comprises at least one phosphor material that is operable to absorb at least a portion of the light emitted by the LED chip array and/or discrete LEDs and in response emit light having a different dominant wavelength. The phosphor material can be operable to emit green light having a dominant wavelength in a range 510 nm to 550 nm, yellow-green light having a dominant wavelength in a range 550 nm to 570 nm, yellow light having a dominant wavelength in a range 570 nm to 590 nm or orange light having a dominant wavelength in a range 590 to 630 nm or a combination thereof. The phosphor material which is typically in powder form is mixed with a light transmissive polymer such as an epoxy or silicone and the phosphor/polymer mixture applied to at least the light emitting surfaces of the LED chip array. Alternatively the phosphor material can be provided remote to the device. In this patent specification "remote" means "not in direct contact with or separated". Typically in such an arrangement the phosphor material can be provided as a uniform layer on a light transmissive window or uniformly distributed throughout the volume of the window. The phosphor material can comprise an organic or inorganic material such as a YAG material; a silicate material; a nitride material; a sulfate material; an aluminate material; an oxynitride material; an oxysulfate material or mixture thereof.

Preferably the LED chip array comprises GaN-based LEDs. The discrete LEDs can comprise GaN-based LEDs, InN-based LEDs, GaInAlP-based LEDs, GaAlAs-based LEDs, GaAlP-based LEDs or GaP-based LEDs.

Light emitting devices in accordance with the invention are particularly suited for lighting applications that utilize a high drive voltage such as 40V, 110V, 220V or 240V. In this patent specification a "high" voltage refers to a voltage that is at least ten times the forward drive voltage of an individual LED (typically ≈3V).

According to further aspect of the invention a light emitting device that is drivable from a selected voltage comprises: an LED chip array comprising a plurality of LEDs formed on a single die and having a nominal drive voltage and an actual measured drive voltage and at least one discrete LED connected in series with the LED chip array, wherein the number of discrete LEDs is selected to prevent overdriving of the LED chip array at the selected drive voltage.

Advantageously the LED chip array is configured to be AC-drivable and the device comprises a plurality of discrete LEDs that are configured to be AC-drivable. Preferably the discrete LEDs are configured such that positive and negative half wave periods of an AC drive voltage are mapped onto oppositely connected LEDs such that oppositely connected LEDs are alternately operable on a respective half wave period. In one arrangement at least two discrete LEDs are connected in parallel in opposite polarity. Alternatively the discrete LEDs can be connected in a bridge configuration.

According to a further aspect of the invention a light emitting device comprises: an LED chip array comprising a plurality of LEDs formed on a single die and operable to emit blue light having a peak wavelength in a range 455 nm to 460 nm and at least one discrete LED that is separate from the LED chip array connected in series with the LED chip array and operable to emit red light having a dominant wavelength in a range 620 nm to 670 nm.

According to a yet further aspect of the invention a light emitting device comprises: an LED chip array comprising a plurality of LEDs formed on a single die and at least one discrete LED that is separate from the LED chip array connected in series with the LED chip array, wherein the device is operable directly from a high drive voltage of at least 40 volts, at least 110 volts or at least 220 volts.

BRIEF DESCRIPTION OF THE DRAWINGS

In order that the present invention is better understood light emitting devices according to embodiments of the invention will now be described, by way of example only, with reference to the accompanying drawings in which.

DETAILED DESCRIPTION OF THE INVENTION

Figure 1:
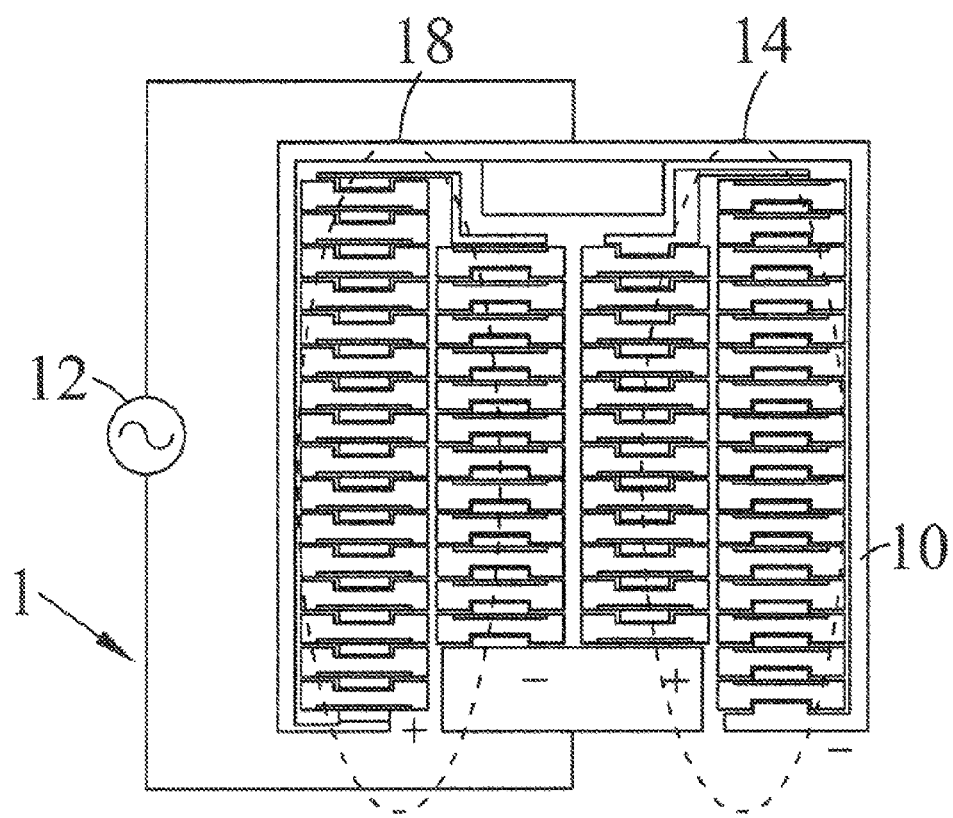
FIG. 1 is a schematic view of a prior art AC-drivable single-chip integrated LED as previously described.
Figure 2:
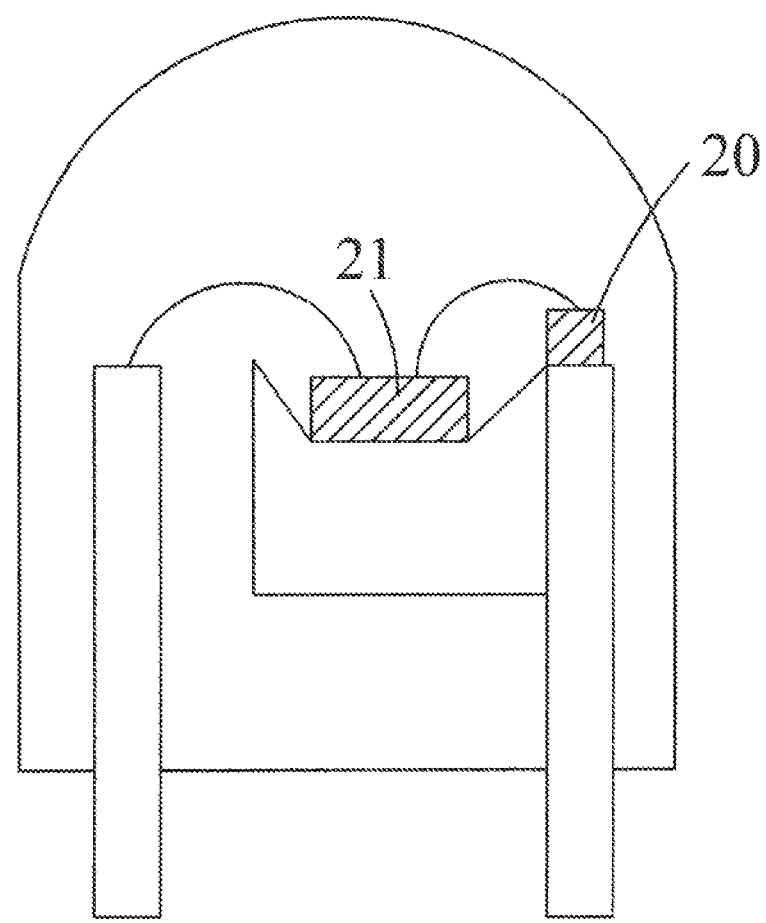
FIG. 2 is a schematic view of a prior art AC-drivable light emitting device as previously described.
Figure 3:
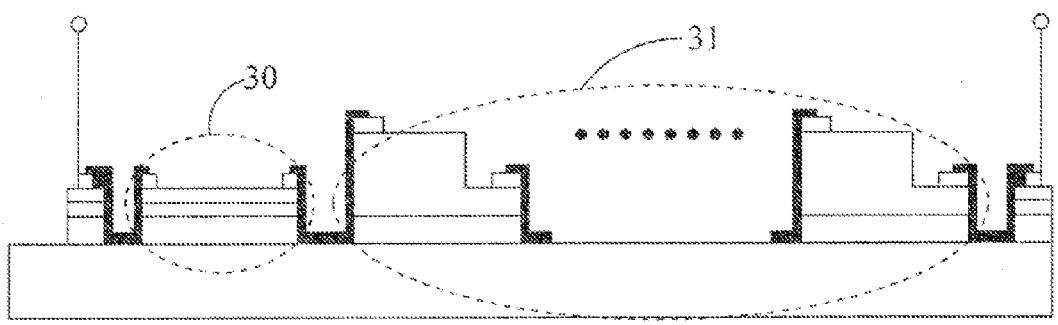
FIG. 3 is a schematic sectional-view of a prior art AC/DC-drivable LED device with integrated protection as previously described.
Figure 4:
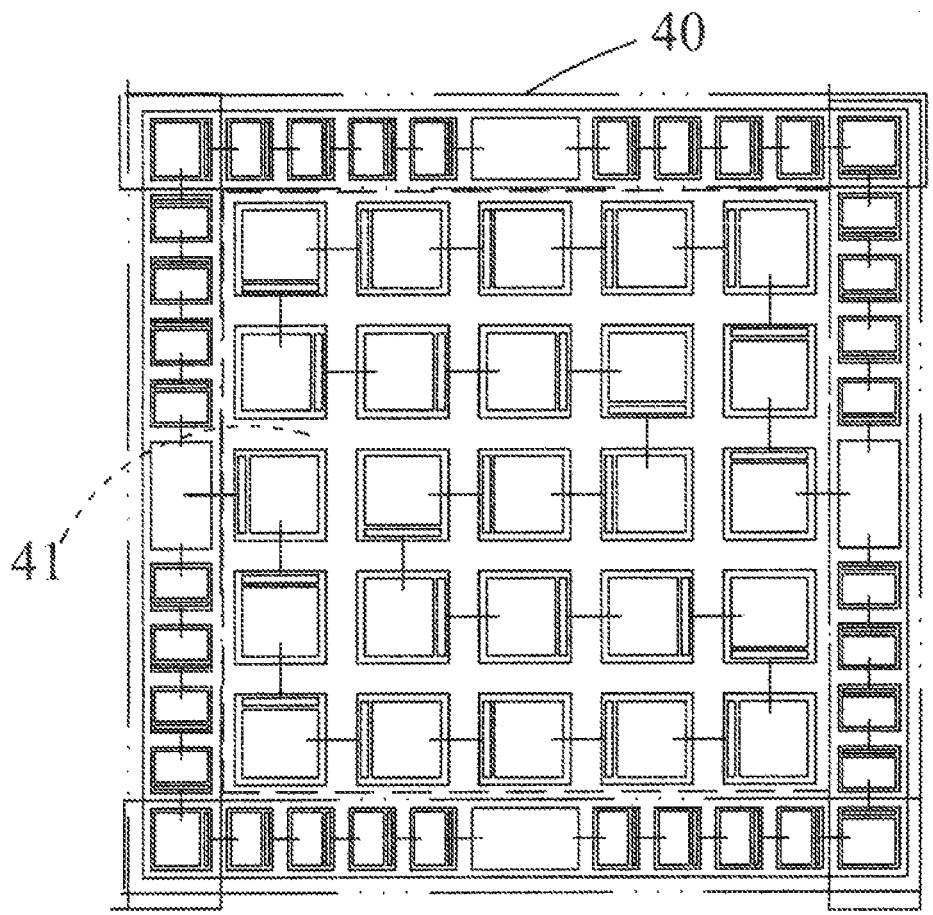
FIG. 4 is a schematic plan view of a prior art AC-drivable LED as previously described.

Throughout this specification like reference numerals are used to denote like parts.

Embodiments of the invention concern light emitting devices that are drivable directly from a high voltage sources such as for example 30V, 48V, 110V, 220V or 240V. In this patent specification "drivable directly" means is capable of being driven (operated) from a high voltage source without the need of drive circuitry or a transformer to step down the voltage. Moreover "high voltage" refers to a voltage that is many times, typically at least ten time, the forward drive voltage of an individual LED. Devices in accordance with various embodiments can be AC- or DC-drivable and in the case of the former is preferably directly operable from an AC power source without the need of rectifier circuitry. Light emitting devices of the invention comprise a monolithic LED chip array having a nominal drive voltage. In this patent specification a "monolithic LED chip array" refers to a plurality of LEDs that are formed on a single die (substrate). To compensate for variations in the actual drive voltage of the LED chip array arising from variations in the forward drive voltage of LEDs within the LED chip array, devices in accordance with the invention further comprise one or more discrete LEDs (i.e. separate from the LED chip array and not formed on the same die) connected in series with the LED chip array. The number of discrete LEDs is selected to prevent overdriving of the LED chip array when the device is operated at the selected drive voltage. Light emitting devices of the invention provide the advantage that the discrete LEDs contribute to the light emission of the device in addition to maintaining an appropriate drive voltage for the LED chip array.

An AC-drivable light emitting device 50 in accordance with an embodiment of the invention is now described with reference to FIGS. 5, 6 and 7 which respectively show a schematic plan view of the light emitting device 50, a perspective view of the device and a cross-sectional view of the light emitting device through a line A-A. The device 50 is intended to be operated directly from a 110V (r.m.s.) AC mains supply as is common in the United States.

Figure 5:
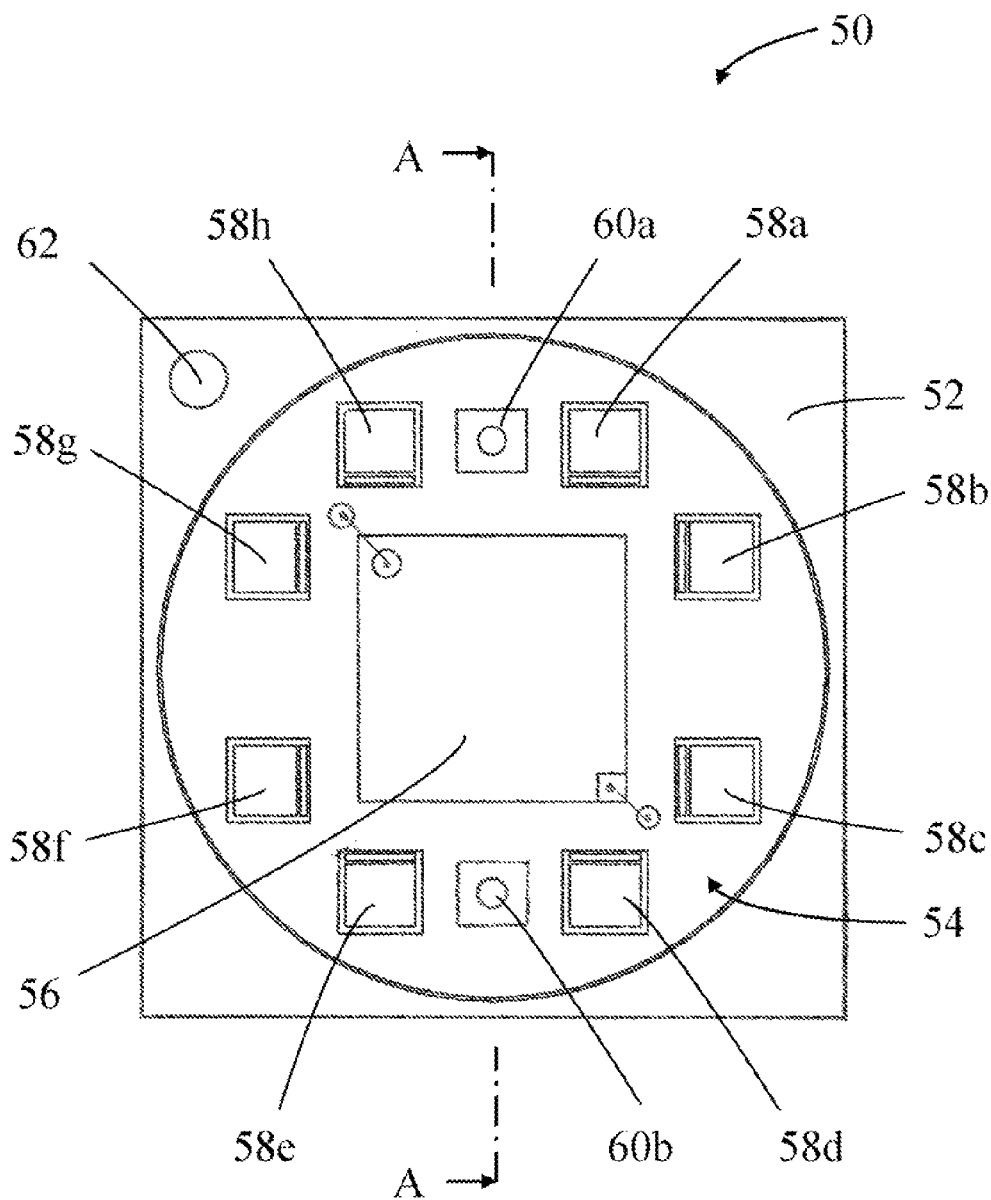
FIG. 5 is a plan view of an AC-drivable light emitting device in accordance with an embodiment of the invention.
Figure 6:
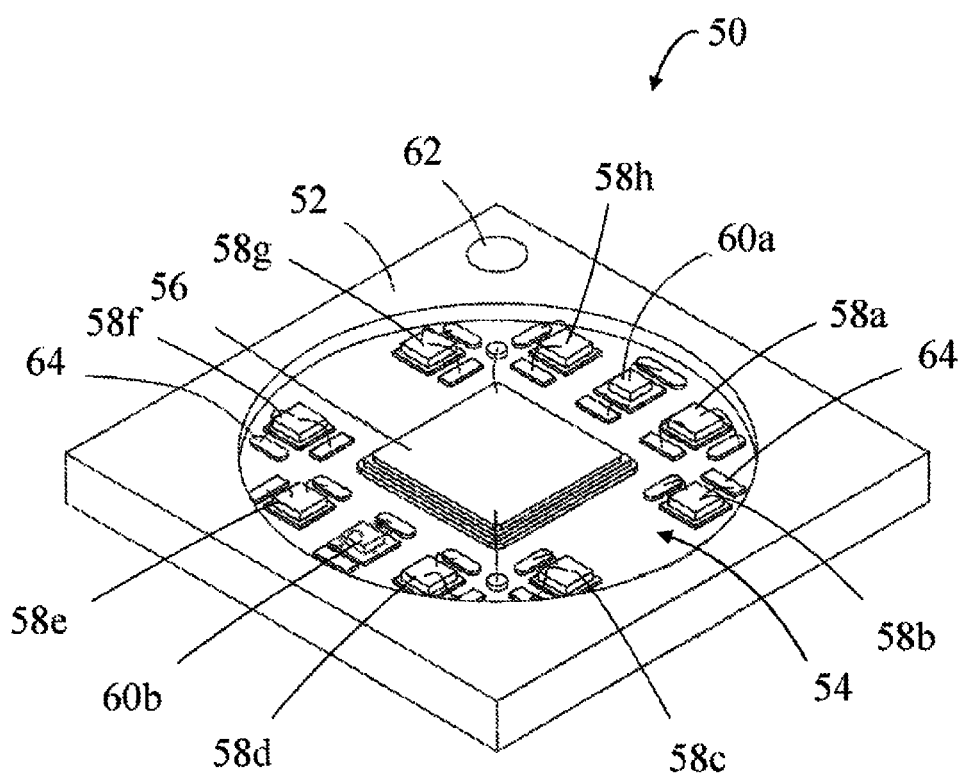
FIG. 6 is a perspective view of an AC-drivable light emitting device of FIG. 5.

Referring to FIGS. 5 and 6 the AC-drivable light emitting device 50 comprises a package (lead frame) 52 that includes in an upper surface (as shown) a shallow circular recessed area 54 and an AC-drivable GaN (gallium nitride) LED chip array 56 mounted to the floor of the circular recessed area 54. In accordance with the invention the device further comprises a driver circuit that comprises a plurality of discrete blue light emitting LED chips 58 and discrete red light emitting LED chips 60. In this patent specification "discrete" means that the LED chips 58, 60 are not an integrated part of the LED chip array 56. The circular recessed area 54 is for die bonding and wire bonding the LED chip array 56 and the discrete LEDs 58, 60 and includes a pattern of conductive tracks to connect the LED chip array 56 and discrete LED chips 58, 60 in a selected circuit configuration.

The LED chip array 56 is located at a central area of the recess 54. As shown (FIG. 5) the discrete LED chips 58, 60 are also mounted to the floor of the recessed area 54 around the periphery of the LED chip array and in the example illustrated comprise eight blue LED chips 58a to 58h and two red LED chips 60a, 60b. As will be described further the total number, relative proportion of red to blue LED chips and interconnection of the discrete LED chips is configured to provide appropriate voltage compensation for the LED chip array 56 and to enhance the CRI of the device. The blue LED chips 58a to 58h preferably comprise GaN lateral-electrode LED chips and are operable to generate blue light having a peak wavelength in a range 455 nm to 460 nm. The red LED chips 60a, 60b can comprise AlGaInP (aluminum gallium indium phosphide), AlGaAs/GaAs (aluminum gallium arsenide/Gallium arsenide), GaAsP/GaP (gallium arsenic phosphide/gallium phosphide) or InGaN/SiC (indium gallium nitride/silicon carbide) vertical-electrode LED chip that are operable to generate red light having a peak wavelength in a range 620 nm to 650 nm. The use of different types of discrete LED chips 58, 60 enables a greater flexibility in drive voltage compensation since each different type of LED chip will have a different forward drive voltage. For example the forward drive voltage of a GaN blue LED chip is typically of order 3.3V whilst the forward drive voltage for a red LED chip is of order 2.2V. Additionally the use of one or more discrete red LED chips 60 can increase the CRI of light generated by the device.

The device can further comprise bonding pads 64 (not show in FIG. 5) on the floor of the recess 54 and a marker 62 disposed on the lead frame 52.

Figure 7:
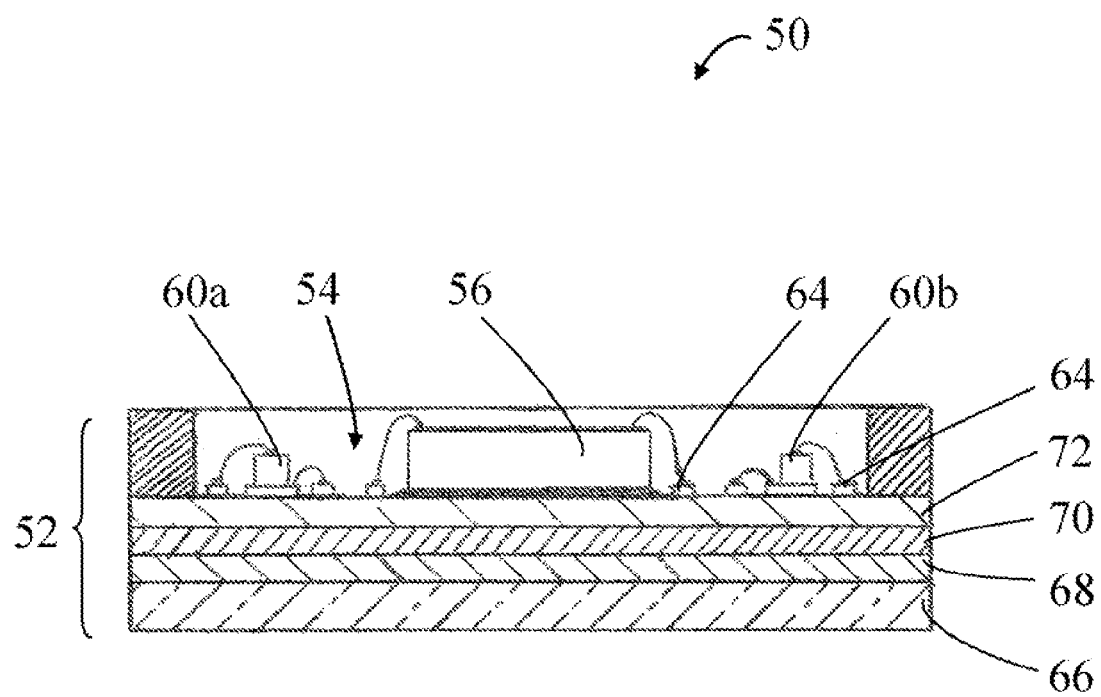
FIG. 7 is a cross-sectional view of the device of FIG. 5 through a line A-A.

FIG. 7 shows a cross-sectional view of the light emitting device 50 of FIG. 5 through A-A. The package 52 comprises a layered structure that can be made of a low temperature co-fired ceramic (LTCC) material such as aluminum nitride-based (AlN-based) or an aluminum oxide-based (AlO-based) composite material. The package comprises in order from the base i) a circuit-layer 66 having a plurality of bonding pads with a primary function of providing a compatible surface mount technology (SMT) such that the light emitting device 50 is directly mountable to a conventional printed circuit board (PCB), ii) a plurality of intervening circuit-layers 68, 70 for bridging the discrete LED chips 58, 60 and electrically connecting the discrete LED chips 58, 60 and the LED chip array 56 in a selected circuit configuration and iii) an uppermost circuit-layer 72 for die bonding and wire bonding the LED chip array 54 and discrete LED chips 56, 58.

The AC-drivable LED chip array 56 comprises a monolithically fabricated LED chip array that comprises a plurality of LEDs formed on a single die and that are interconnected such that they can be operated directly from an AC source without the need of additional rectifier circuitry. For example the LEDs of the chip array can be connected as two or more strings of series-connected LEDs in which the strings of LEDs are connected in parallel with the LEDs in opposite polarity in a half-wave rectifier configuration such that the LED chip array is self-rectifying. Alternatively the LEDs of the chip array can be connected in a bridge configuration or other AC-drivable configurations.

Figure 8:
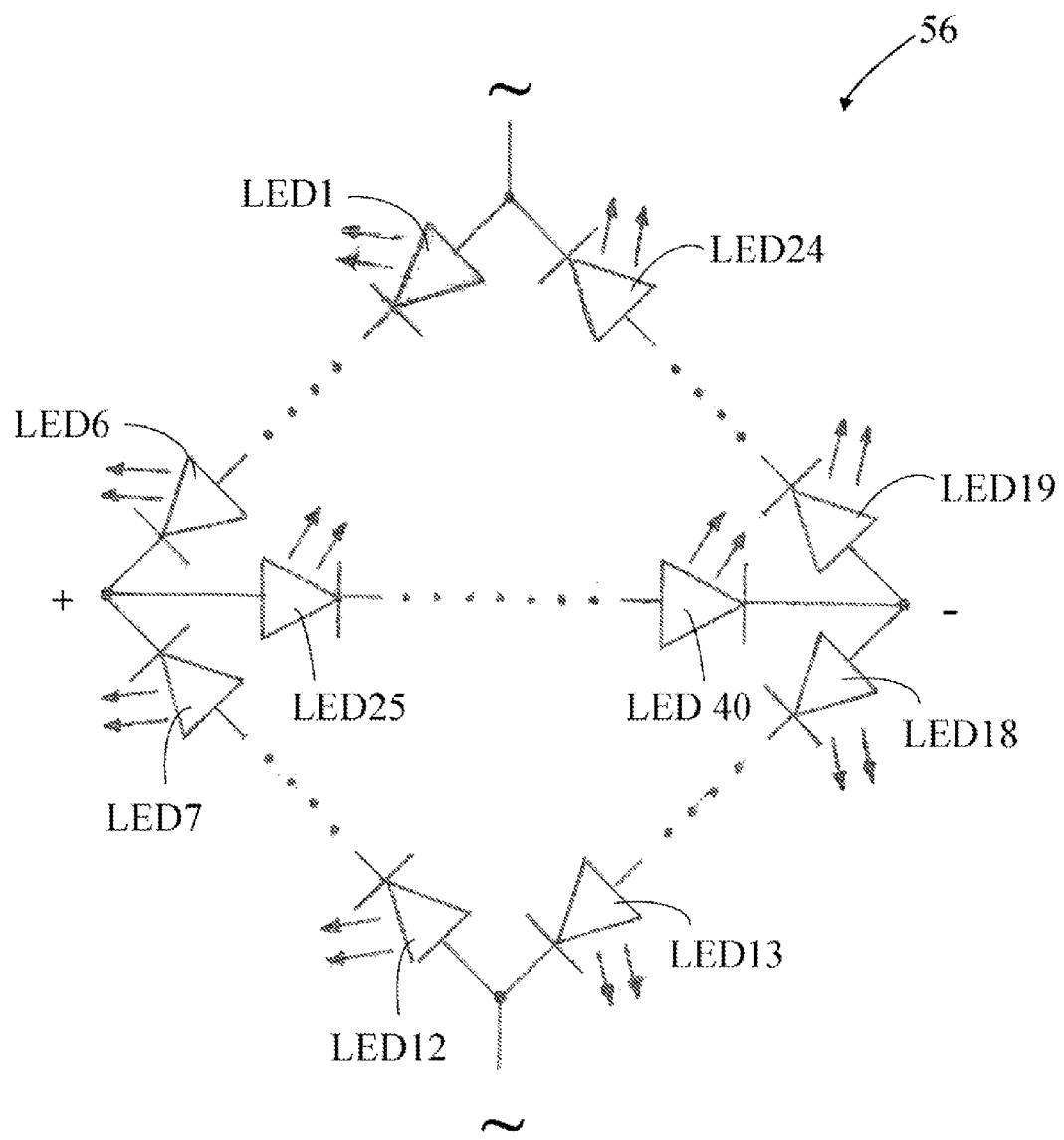
FIG. 8 is an equivalent circuit of an AC-drivable LED chip array.

FIG. 8 is a schematic of an equivalent circuit of an AC-drivable LED chip array 56. The LED chip array 56 comprises forty LEDs (LED1 to LED40). As illustrated the LEDs are connected as a self-rectifying arrangement that comprises a full-wave bridge rectifier circuit. Each arm of the bridge comprises six series-connected LED in which the first arm comprises series-connected LED1 to LED6; the second arm comprises series-connected LED7 to LED12; the third arm series-connected LED13 to LED18 and series-connected LED19 to LED24 in the fourth arm. The remaining sixteen LEDs (LED25 to LED40) are connected in series between the rectifying nodes (+, −) of the bridge circuit. In operation twenty eight LEDs are operable on each half cycle of drive voltage. On each positive half cycle LED1 to LED 6, LED25 to LED40 and LED18 to LED13 are operable whilst on each negative half cycle LED7 to LED12, LED25 to LED40 and LED19 to LED24 are operable. As described the voltage drop across a GaN LED is typically of order 3.3V and consequently the LED chip array will drop ≈92.4V. To enable the device to be directly drivable from a 110V supply requires an additional 17.6V drop and in accordance with the invention this voltage drop is provided by the configuration of discrete LEDs 58, 60.

Figure 9:
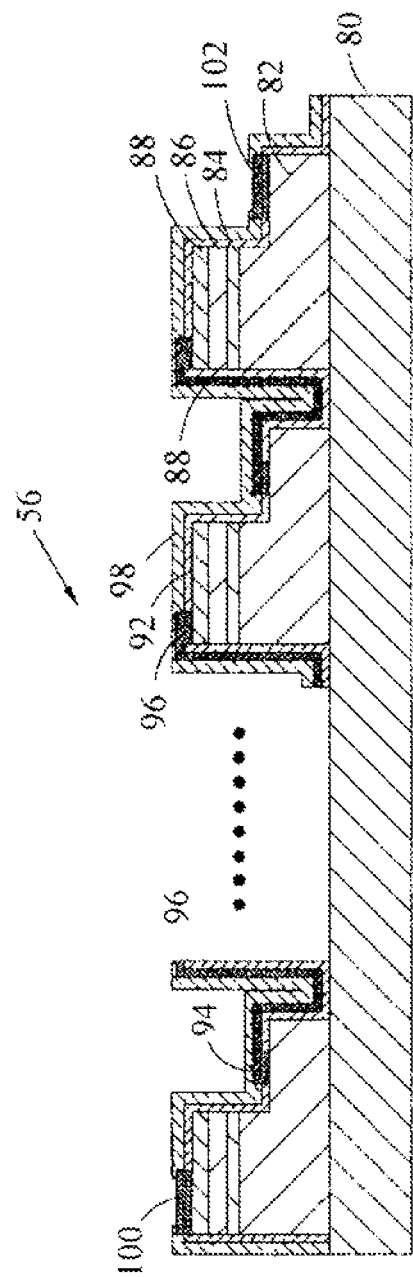
FIG. 9 is a schematic cross-sectional view of an AC-drivable LED chip array

FIG. 9 is a cross-sectional schematic of the AC-drivable LED chip array 56. The LED array 56 comprises in order an electrically insulating sapphire substrate 80 on which are grown sequentially at least one n-type GaN (gallium nitride) layer 82, a GaInN (gallium indium nitride) light emitting layer 84 and a p-type GaN layer 86. As is known the various layers are fabricated by a Metal Organic Chemical Vapor Deposition (MOCVD) process or an electron beam epitaxy (EBE) process to form an epitaxial wafer. Photolithography and etching processes are used to remove portions of the p-type GaN layer 86, GaInN light emitting layer 84 and n-type GaN layer 82 to expose an insulating sapphire substrate 80 and electrically isolate each LED chip. A transparent conductive layer 88 is formed on the p-type GaN layer 86 and photolithography and etching processes used to selectively remove portions of the transparent conductive layer 88, p-type GaN layer 86, GaInN light emitting layer 84 and n-type GaN layer 82 to expose the n-type GaN layer as an ohmic contact layer. Then $SiO_2$, $Si_3N_4$ or SOG is deposited to serve as a first insulating layer 90 for the electric isolation required for the electrode bridge process of each independent LED chip on the sapphire substrate 80. An ohmic contact anode 92 and an ohmic contact cathode 94 are formed on the transparent conductive layer 88 and the n-type GaN layer 82 to form electrodes 96 for serially connecting the anode and cathode of different LED chips, so as to produce a conventional GaN LED chip array of a transverse electrode distribution. A second insulating protection layer 98 is formed on the chip array and anode 100 and cathode 102 bonding pads of the LED chip array 56 are exposed. Finally, the wafer goes through a grinding and dicing process to form each independent LED chip array 56.

In general, the present yield rate of the LED process cannot guarantee that each LED chip array 56 has the same photoelectric properties, and thus the same alternating current (AC) value cannot be obtained in the same direct current (DC) testing. As a result, it is necessary to characterize each LED chip array according to its AC drive voltage. For example for an LED chip array 56 composed of forty LED chips that is AC-driven on positive or negative half wave periods (or an equivalent DC driving), only approximately twenty eight LED chips will emit lights. If 10 mA forward DC current is used for testing each GaN LED chip and the forward AC current value of each LED is 3.7V, then the accumulated voltage of twenty eight LED chips will be 103.6V. If a 10 mA forward DC current is used for testing each GaN LED chip and the forward AC value of each LED chip is equal to 4.0 volts, then the accumulated voltage of twenty eight LED chips will be equal to approximately 112V. As described above, the photoelectric properties of each LED chip vary slightly and thus the accumulated voltage of the LED chips of the LED chip array 56 is not consistent, and it is necessary to characterize each LED chip array 56 according to an actual drive voltage range $V_{ARRAY}$ in an AC application. For example, the LED chip array can be classified by voltage range for example a voltage of 100.1~102.5V is classified as one type, and a voltage of 102.6~105V is classified as another type, and so on.

An AC utility power with a specification of 110V refers to a root mean square (RMS) value represented by V rms, which is equivalent to a peak voltage Vp of 155.5V. If an AC utility power of 110V is applied directly to a 102.6~105V LED chip array 56, each LED chip will drop a peak voltage Vp of approximately 5.6V, and thus an over-current is passed through each LED chip which can result in the device burning out.

Figure 10:
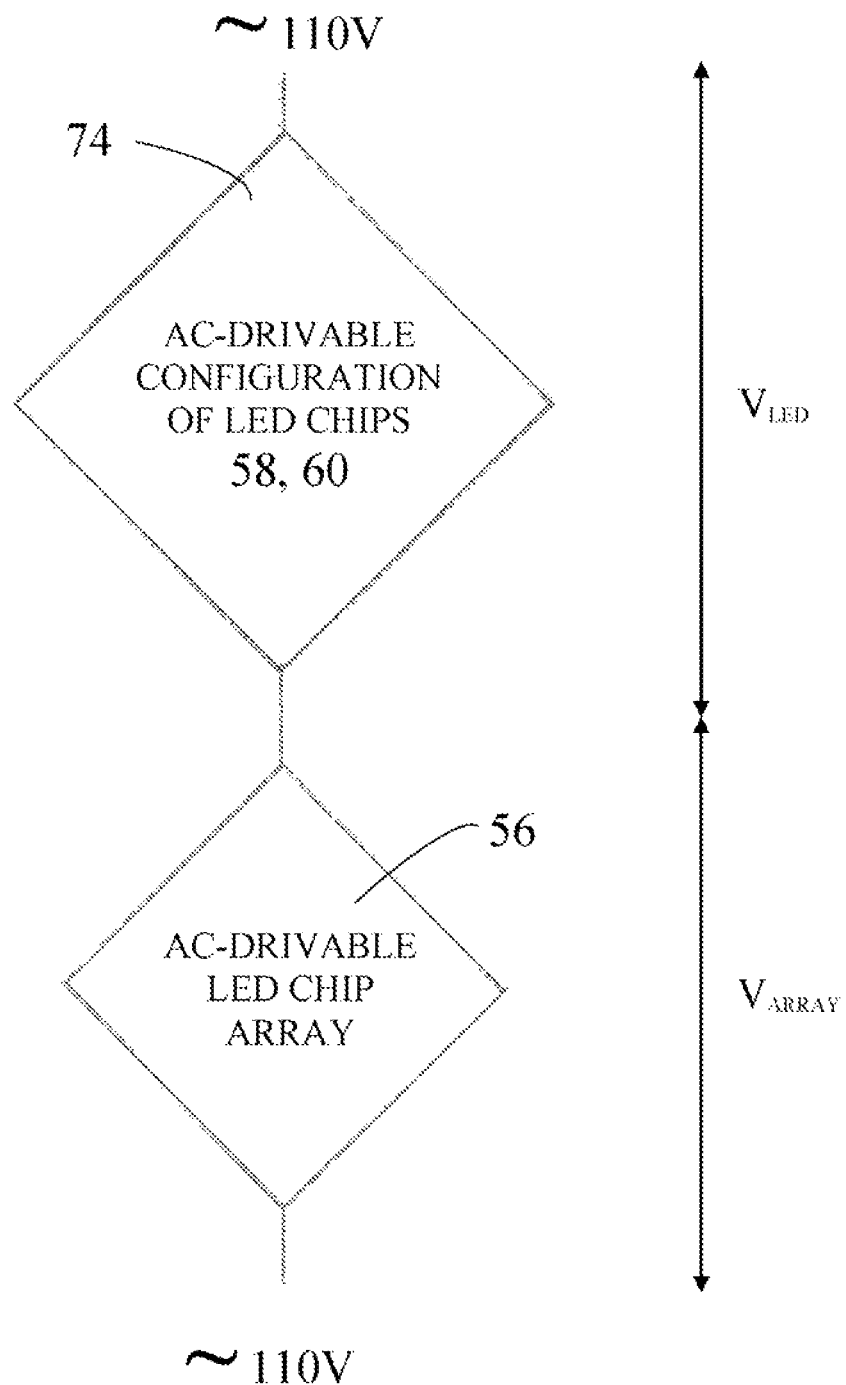
FIG. 10 is an equivalent circuit of the AC-drivable light emitting device in accordance with the invention.

As shown in FIG. 10 and to protect the LED chip array 56 against an over-current the discrete LED chips 58, 60 are added in the packaging process and connected in a bridge or other AC-drivable configuration. The number of discrete LED chips and their interconnection is selected to prevent overdriving of the LED chip array when the device is operated at the nominal drive voltage. Exemplary circuit configurations based on eight blue LED chips 58a to 58h and two discrete red LED chips 60a, 60b for driving LED chip arrays 56 with differing actual drive voltages $V_{ARRAY}$ are now described with reference to FIGS. 11 to 17

Figure 11:
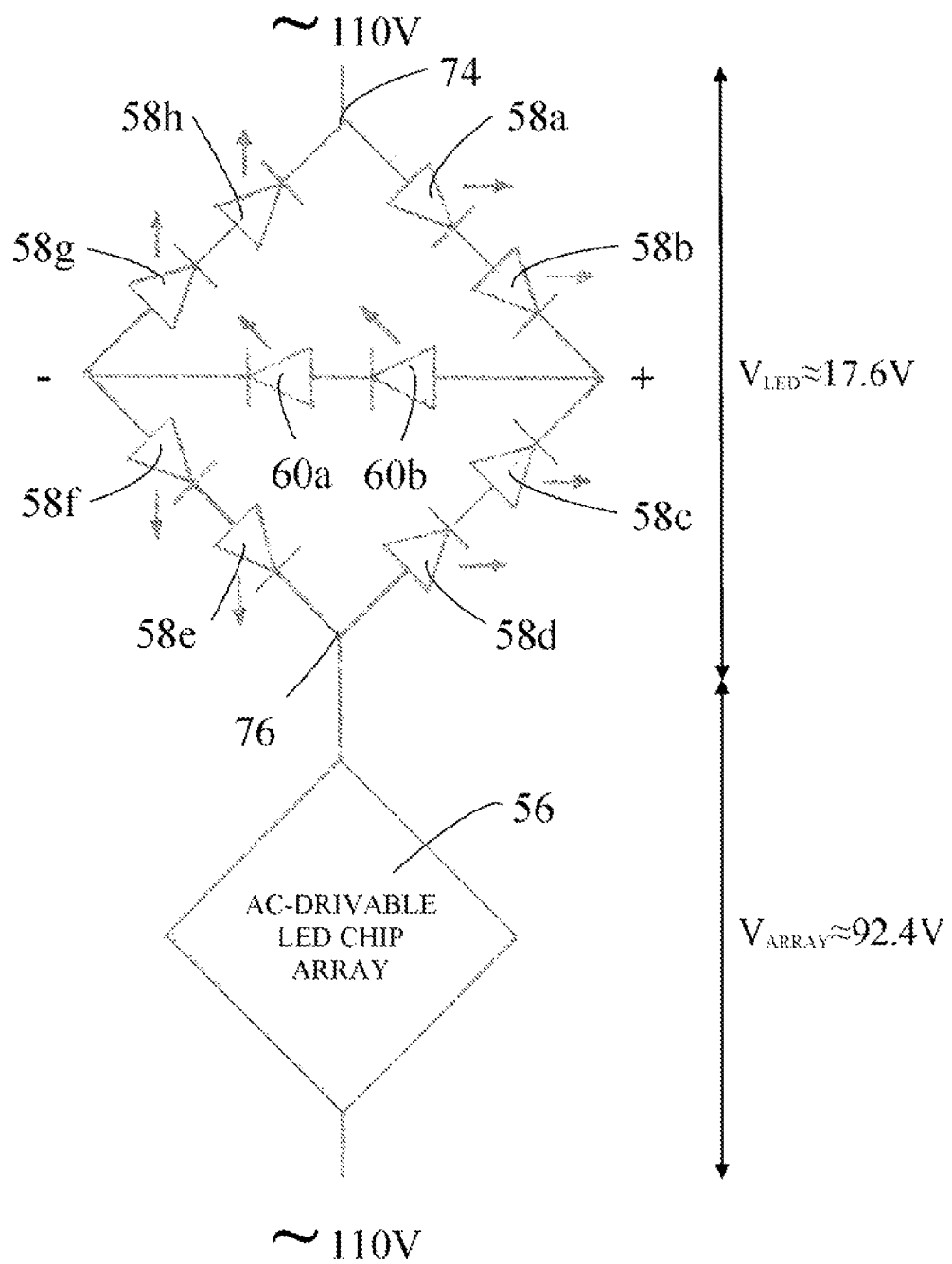
FIGS. 11 to 17 are equivalent circuits AC-drivable light emitting device in accordance with various embodiments of the invention.

FIG. 11 is a schematic of an equivalent circuit of the light emitting device 50 of the invention that is configured for operating a $V_{ARRAY}$=92.4V LED chip array 56 directly from a 110V AC supply. As illustrated the eight discrete blue LED chips 58a to 58h and two discrete red LEDs 60a, 60b are connected in a full-wave bridge rectifier configuration. Each arm of the bridge comprises two series-connected blue LEDs in which the first arm comprises series-connected blue LED chips 58a, 58b; the second arm comprises series-connected blue LED chips 58c, 58d; the third arm series-connected blue LED chips 58e, 58f and the fourth arm series-connected blue LED chips 58g, 58h. The two red LED chips 60a, 60b are connected in series between the rectifying nodes (+, −) of the bridge circuit. In operation six LED chips (four blue and two red) are operable on each half cycle of drive voltage. On each positive half wave period current flows from a node 74 connected to the power supply through the LEDs 58a, 58b, 60a, 60b, 58e, 58f to a node 76 which is connected to the LED chip array 56. Conversely on negative half wave period current flows from the node 76 through the LEDs 58c, 58d, 60a, 60b, 58g, 58h to the node 74. Assuming a forward voltage drop across each blue LED chip of ≈3.3V and a forward voltage drop across each red LED chip of ≈2.2V the compensation circuit will drop $V_{LED}$≈17.6V (=4×3.3V+2×2.2V) on each half cycle of drive voltage. Since the discrete LED chips are connected in a bridge configuration, such a circuit configuration not only provides drive voltage compensation to the LED chip array 56 but additionally generates light that contributes to the emission product of the device. The discrete LED chips 58 can generate light having the same wavelength as that of the LED chip array 56 or a different color of light. In the case of the latter this can provide increase the CRI of a white light emitting device. In operation the LED chips 58a, 58b, 60a, 60b, 58e, 58f limit the forward drive current of the LED chip array 56 during the positive half wave periods and the LED chips 58c, 58e, 60a, 60b, 58g, 58h limit the drive current during negative half wave periods.

Figure 12:
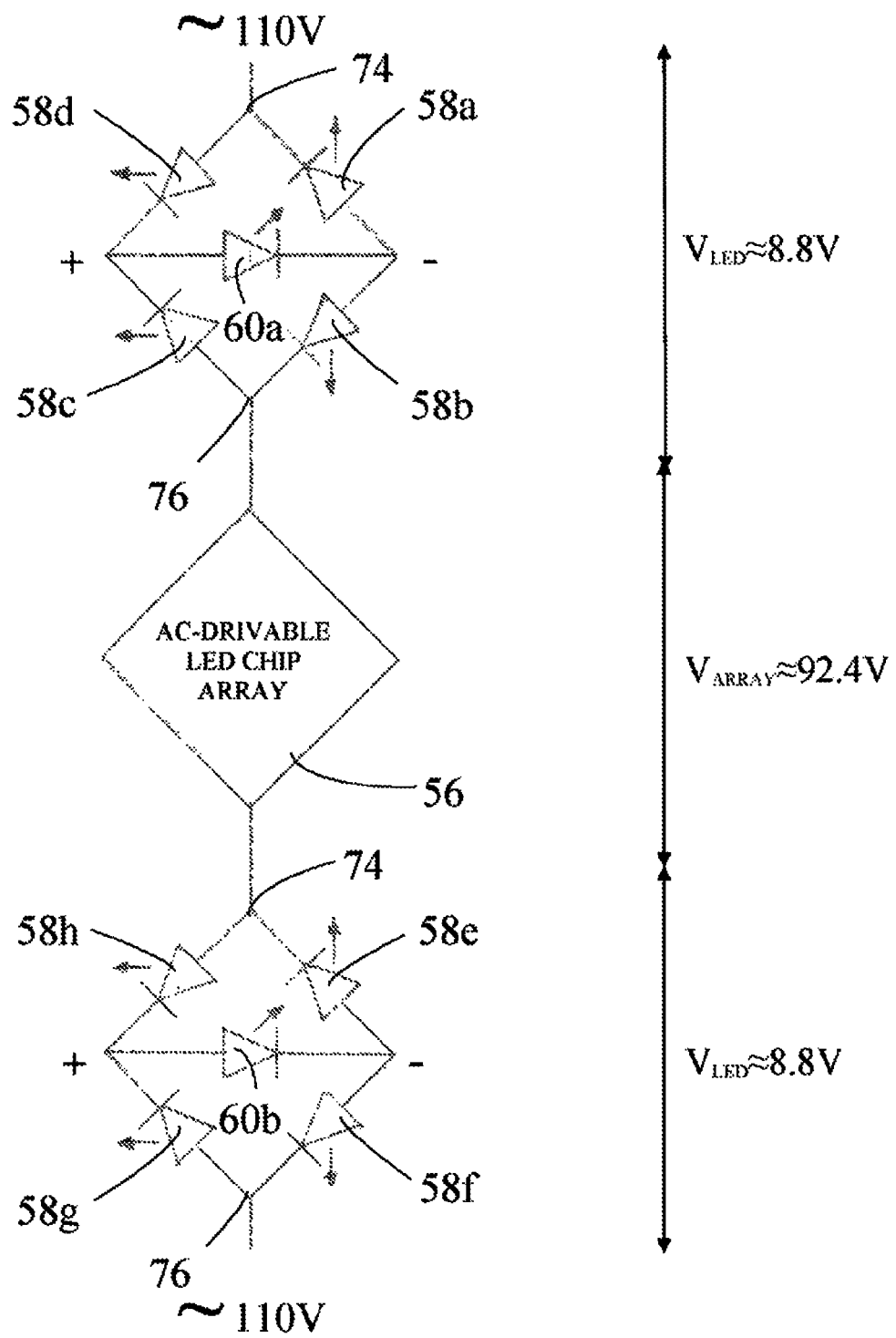

FIG. 12 is a schematic of an alternative equivalent circuit of a light emitting device of the invention that utilizes an LED chip array 56 with an actual drive voltage $V_{ARRAY}$=92.4V. As illustrated the eight discrete blue LED chips 58a to 58h and two discrete red LEDs 60a, 60b are connected as two full-wave bridge rectifier configurations that are connected in series with the LED chip array 56. In the first bridge rectifier circuit the first arm comprises blue LED chip 58a; the second arm comprises blue LED chip 58b; the third arm blue LED chip 58c, the fourth arm blue LED chip 58d and the red LED chip 60a is connected in series between the rectifying nodes (+, −). Likewise the second bridge circuit comprises in the first arm blue LED chip 58e; the second arm comprises blue LED chip 58*f*; the third arm blue LED chip 58*g*, the fourth arm blue LED chip 58*h* and the red LED chip 60*b* is connected in series between the rectifying nodes (+, −). As in the configuration of FIG. 11, in operation six LED chips (four blue and two red) are operable on each half cycle of drive voltage. On each positive half wave period current flows from node 74 of the first bridge circuit through the LEDs 58*d*, 60*a*, 58*b* to the node 76, through the LED chip array 56 and from node 74 of the second bridge circuit through the LEDs 58*h*, 60*b*, 58*f* to the node 76. Conversely on negative half wave period current flows from node 74 of the second bridge through the LEDs 58*g*, 60*b*, 58*e* to the node 76, through the LED chip array 56 and from node 74 of the first bridge through the LEDs 58*c*, 60*a*, 58*a* to the node 76. The first and second bridge circuits each have a forward voltage drop $V_{LED} \approx 8.8V$ (=2×3.3V+2.2V) on each half cycle of drive voltage. Since the two bridge circuits are connected in series they will drop a total of ≈17.6V on each half cycle of the drive voltage. In operation the LED chips 58*d*, 60*a*, 58*b*, 58*h*, 60*b*, 58*f* limit the forward drive current of the LED chip array 56 during the positive half wave periods and the LED chips 58*g*, 60*b*, 58*e*, 58*c*, 60*a*, 58*a* limit the drive current during negative half wave periods.

Figure 13:
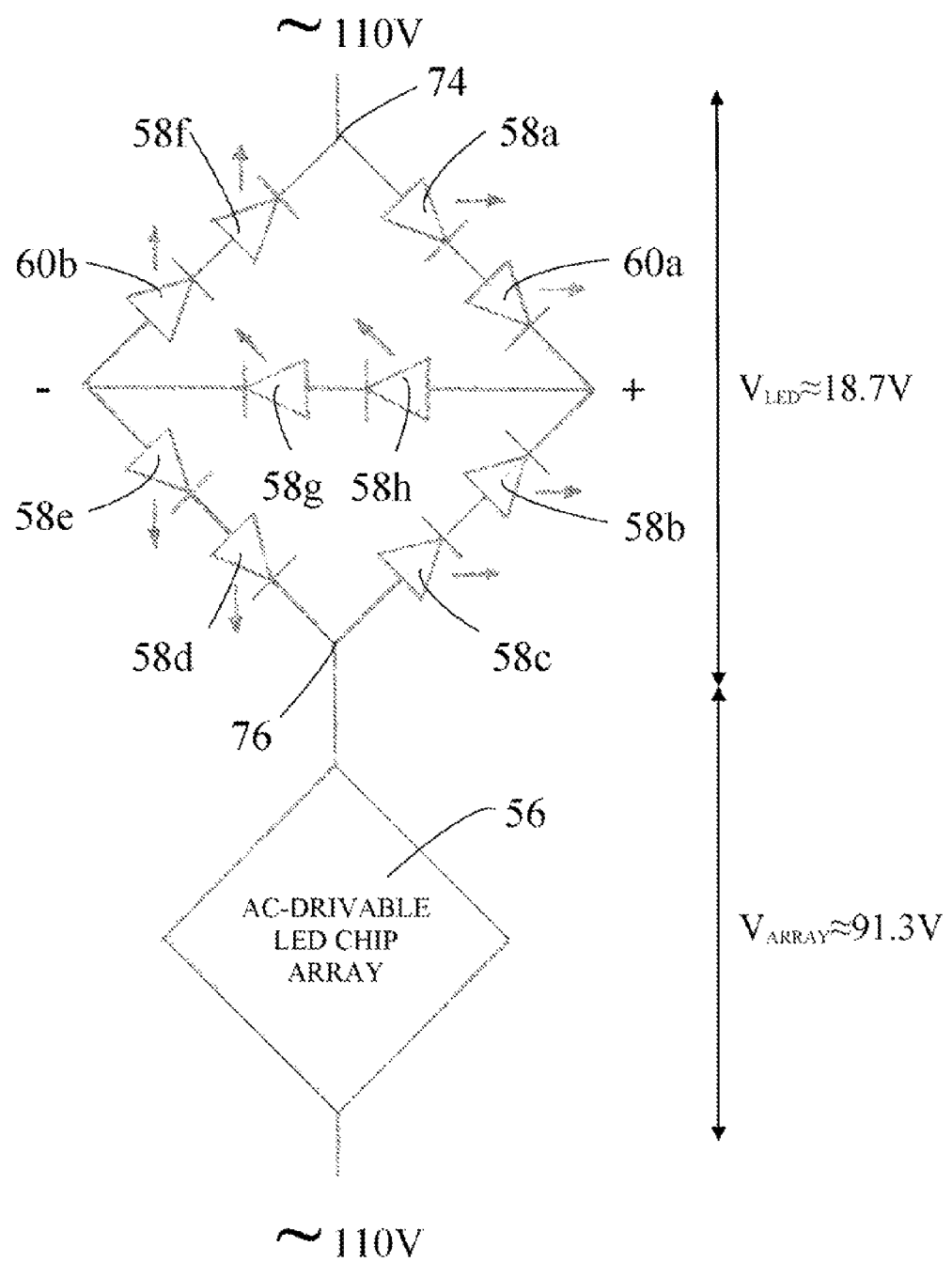

FIG. 13 is a schematic of an equivalent circuit of a light emitting device in accordance with the invention for operating an LED chip array 56 with an actual drive voltage $V_{ARRAY}=91.3V$. As illustrated the eight discrete blue LED chips 58*a* to 58*h* and two discrete red LEDs 60*a*, 60*b* are connected in a full-wave bridge rectifier configuration. Each arm of the bridge comprises two series-connected LEDs in which the first arm comprises series-connected blue LED chip 58*a* and red LED chip 60*a*; the second arm comprises series-connected blue LED chips 58*b*, 58*c*; the third arm series-connected blue LED chips 58*d*, 58*e* and the fourth arm series-connected red LED chip 60*b* and blue LED chip 58*f*. Two blue LED chips 58*g*, 58*h* are connected in series between the rectifying nodes (+, −) of the bridge circuit. In operation six LED chips (five blue and one red) are operable on each half cycle of drive voltage. On each positive half wave period current flows from a node 74 through the LEDs 58*a*, 60*a*, 58*h*, 58*g*, 58*e*, 58*d* to a node 76 and connects the LED chip array 56. Conversely on negative half wave period current flows from the node 76 through the LEDs 58*c*, 58*b*, 58*h*, 58*g*, 60*b*, 58*f* to the node 74 and connects the first LED chip array 54. Assuming a forward voltage drop across each blue LED chip of ≈3.3V and a forward voltage drop across each red LED chip of ≈2.2V the compensation circuit will drop $V_{LED} \approx 18.7V$ (=5×3.3V$_{LED} \approx $2.2V) on each half cycle of drive voltage. In operation the LED chips 58*a*, 60*a*, 58*h*, 58*g*, 58*e*, 58*d* limit the forward drive current of the LED chip array 56 during the positive half wave periods and the LED chips 58*c*, 58*b*, 58*h*, 58*g*, 60*b*, 58*f* limit the drive current during negative half wave periods.

Figure 14:
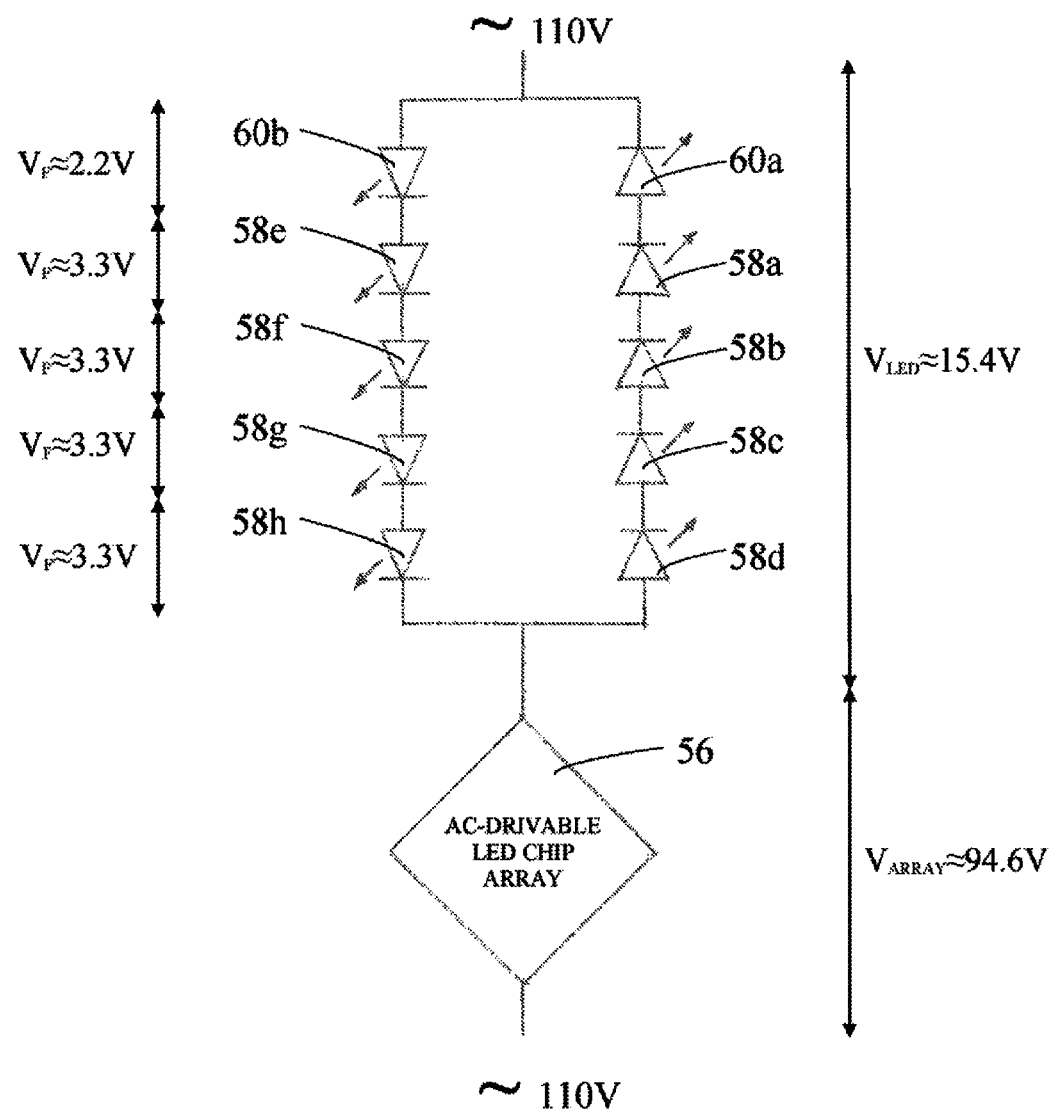

FIG. 14 is a schematic of further equivalent circuit of a light emitting device in accordance with the invention for an LED chip array 56 with an actual drive voltage $V_{ARRAY}=94.6V$. As illustrated the eight discrete blue LED chips 58*a* to 58*h* and two discrete red LEDs 60*a*, 60*b* are connected in a half-wave rectifier configuration comprising two series-connected strings of LED chips connected in parallel in opposite polarity. The first series-connected string comprises discrete red LED chip 60*a* and blue LED chips 58*a* to 58*d* and the second series-connected string comprises discrete red LED chip 60*b* and blue LED chips 58*e* to 58*h*. In operation five LED chips (four blue and one red) are operable on each half cycle of drive voltage. On each positive half wave period current flows through LED chips 60*b*, 58*e* to 58*h*. Conversely on negative half wave period current flows through LED chips 60*a*, 58*a* to 58*d*. Each of the series-connected strings have a forward voltage drop $V_{LED} \approx 15.4V$ (=4×3.3V+2.2V) on each half cycle of drive voltage. In operation the LED chips 60*b*, 58*e* to 58*h* limit the forward drive current of the LED chip array 56 to 10 mA during the positive half wave periods and the LED chips 60*a*, 58*a* to 58*d* limit the drive current during negative half wave periods.

Figure 15:
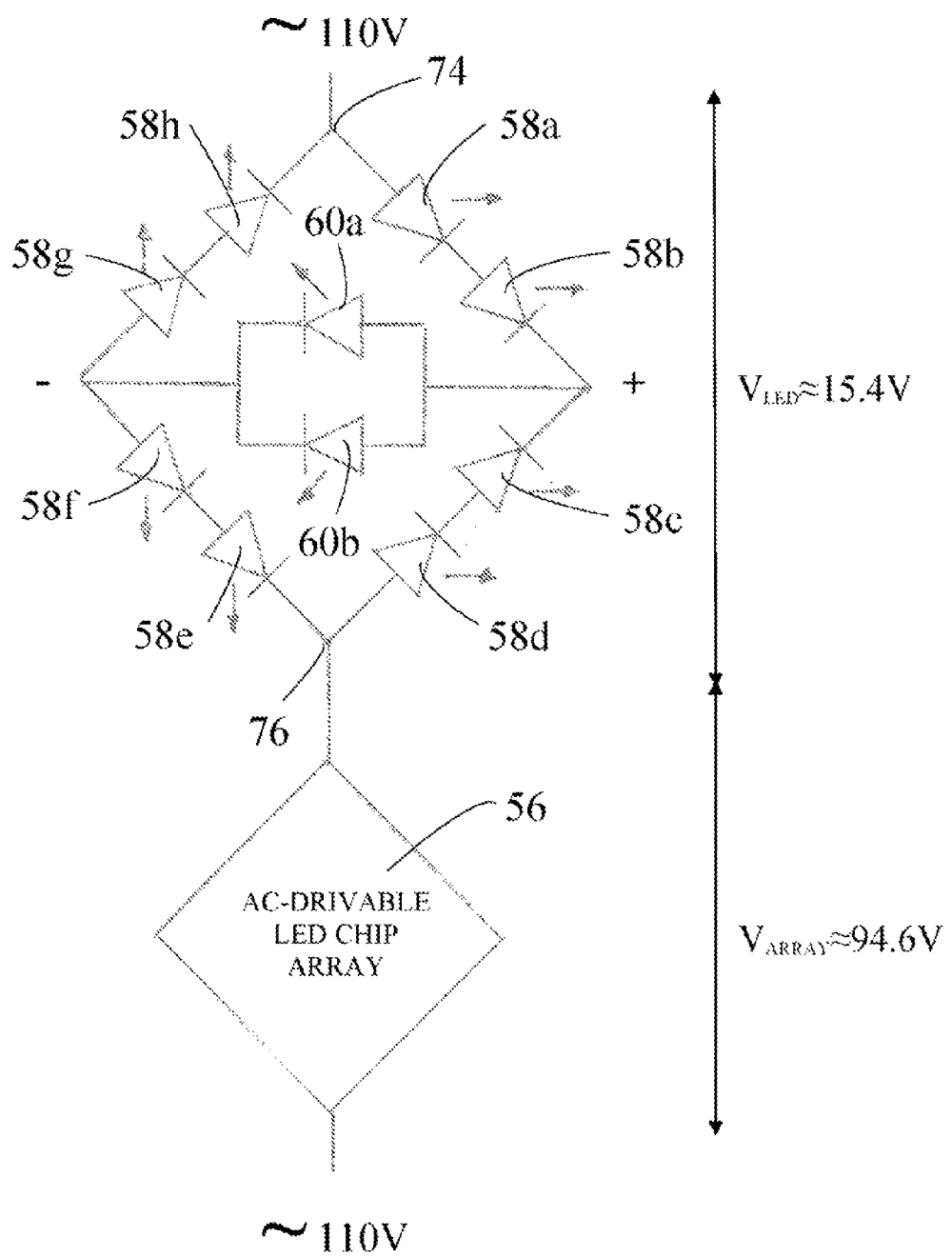

FIG. 15 is a schematic of an alternative equivalent circuit of a light emitting device in accordance with the invention for an LED chip array 56 with an actual drive voltage $V_{ARRAY}=94.6V$. In this arrangement the eight discrete blue LED chips 58*a* to 58*h* and two discrete red LEDs 60*a*, 60*b* are connected in a full-wave bridge rectifier configuration. Each arm of the bridge comprises two series-connected blue LEDs in which the first arm comprises series-connected blue LED chips 58*a*, 58*b*; the second arm comprises series-connected blue LED chips 58*c*, 58*d*; the third arm series-connected blue LED chips 58*e*, 58*f* and the fourth arm series-connected blue LED chips 60*g*, 58*h*. The two red LED chips 60*a*, 60*b* are connected in parallel between the rectifying nodes (+, −) of the bridge circuit. In operation five LED chips (four blue and one two red) are operable on each half cycle of drive voltage. On each positive half wave period current flows from a node 74 through the LEDs 58*a*, 58*b*, 60*a*, 60*b*, 58*h*, 58*e*, 58*f* to a node 76 and connects the LED chip array 56. Conversely on negative half wave period current flows from the node 76 through the LEDs 58*d*, 58*c*, 60*a*, 60*b*, 58*g*, 58*h* to the node 74 and connects the first LED chip array 54. Assuming a forward voltage drop across each blue LED chip of ≈3.3V and a forward voltage drop across each red LED chip of ≈2.2V the compensation circuit will drop $V_{LED} \approx 15.4V$ (=4×3.3V+2.2V) on each half cycle of drive voltage. In operation the LED chips 58*a*, 58*b*, 60*a*, 60*b*, 58*f*, 58*e* limit the forward drive current of the LED chip array 56 during the positive half wave periods and the LED chips 58*d*, 58*c*, 60*a*, 60*b*, 58*g*, 58*h* limit the drive current during negative half wave periods.

Figure 16:
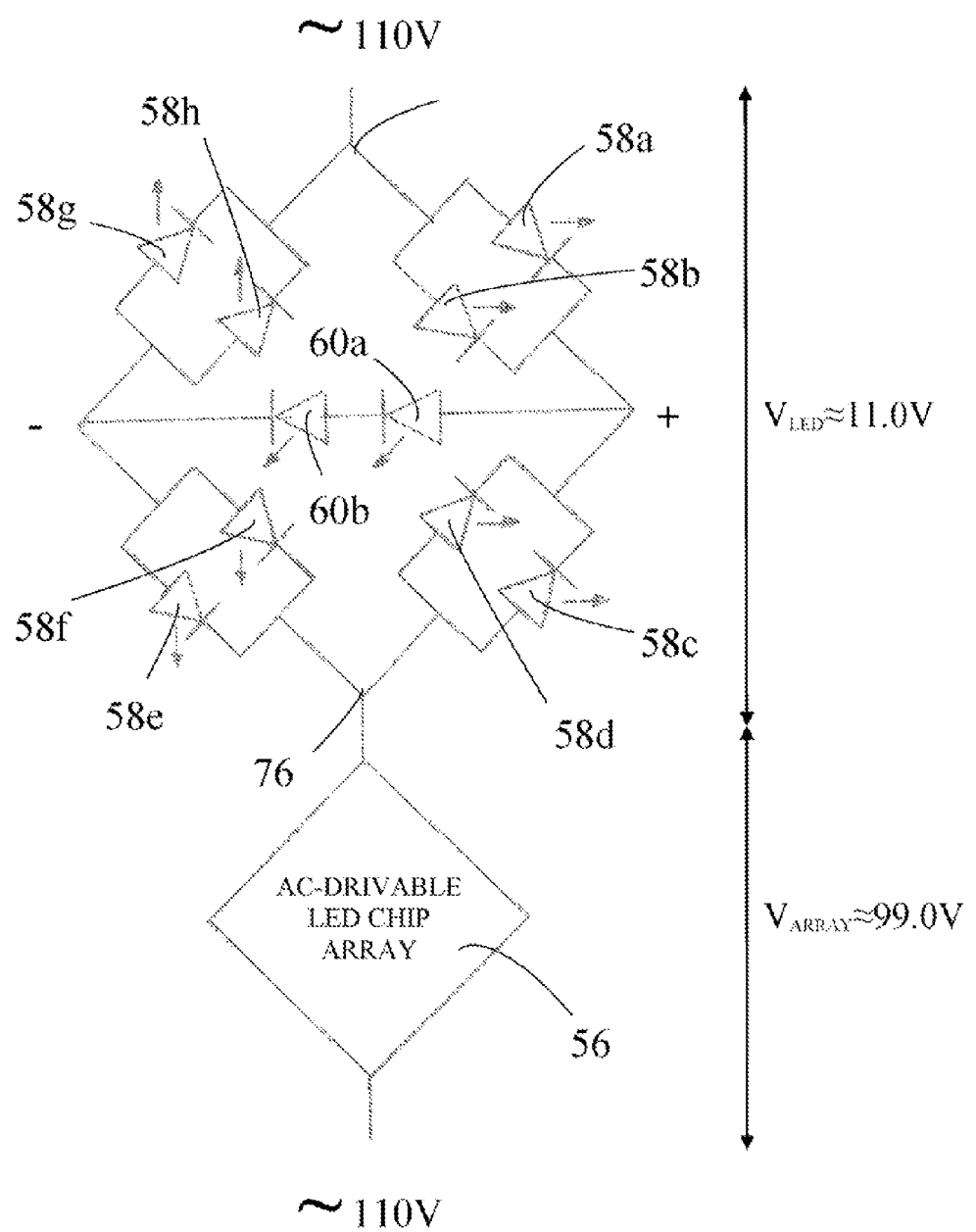

FIG. 16 is a schematic of an equivalent circuit of a light emitting device in accordance with the invention for an LED chip array 56 with an actual drive voltage $V_{ARRAY}=99.0V$. In this arrangement the eight discrete blue LED chips 58*a* to 58*h* and two discrete red LEDs 60*a*, 60*b* are connected in a full-wave bridge rectifier configuration. Each arm of the bridge comprises two parallel-connected blue LEDs in which the first arm comprises parallel-connected blue LED chips 58*a*, 58*b*; the second arm comprises parallel-connected blue LED chips 58*c*, 58*d*; the third arm parallel-connected blue LED chips 58*e*, 58*f* and the fourth arm parallel-connected blue LED chips 58*g*, 58*h*. The two red LED chips 60*a*, 60*b* are connected in series between the rectifying nodes (+, −) of the bridge circuit. In operation six LED chips (four blue and two red) are operable on each half cycle of drive voltage. On each positive half wave period current flows from a node 74 through the LEDs 58*a*, 58*b*, 60*a*, 60*b*, 58*f*, 58*e* to the node 76. Conversely on negative half wave period current flows from the node 76 through the LEDs 58*c*, 58*d*, 60*a*, 60*b*, 58*g*, 58*h* to the node 74. Assuming a forward voltage drop across each blue LED chip of ≈3.3V and a forward voltage drop across each red LED chip of ≈2.2V the compensation circuit will drop $V_{LED} \approx 11.0V$ (=2×3.3V+2×2.2V) on each half cycle of drive voltage. In operation the LED chips 58*a*, 58*b*, 60*a*, 60*b*, 58*e*, 58*f* limit the forward drive current of the LED chip array 56 during the positive half wave periods and the LED chips 58*c*, 58*d*, 60*a*, 60*b*, 58*g*, 58*h* limit the drive current during negative half wave periods.

Figure 17:
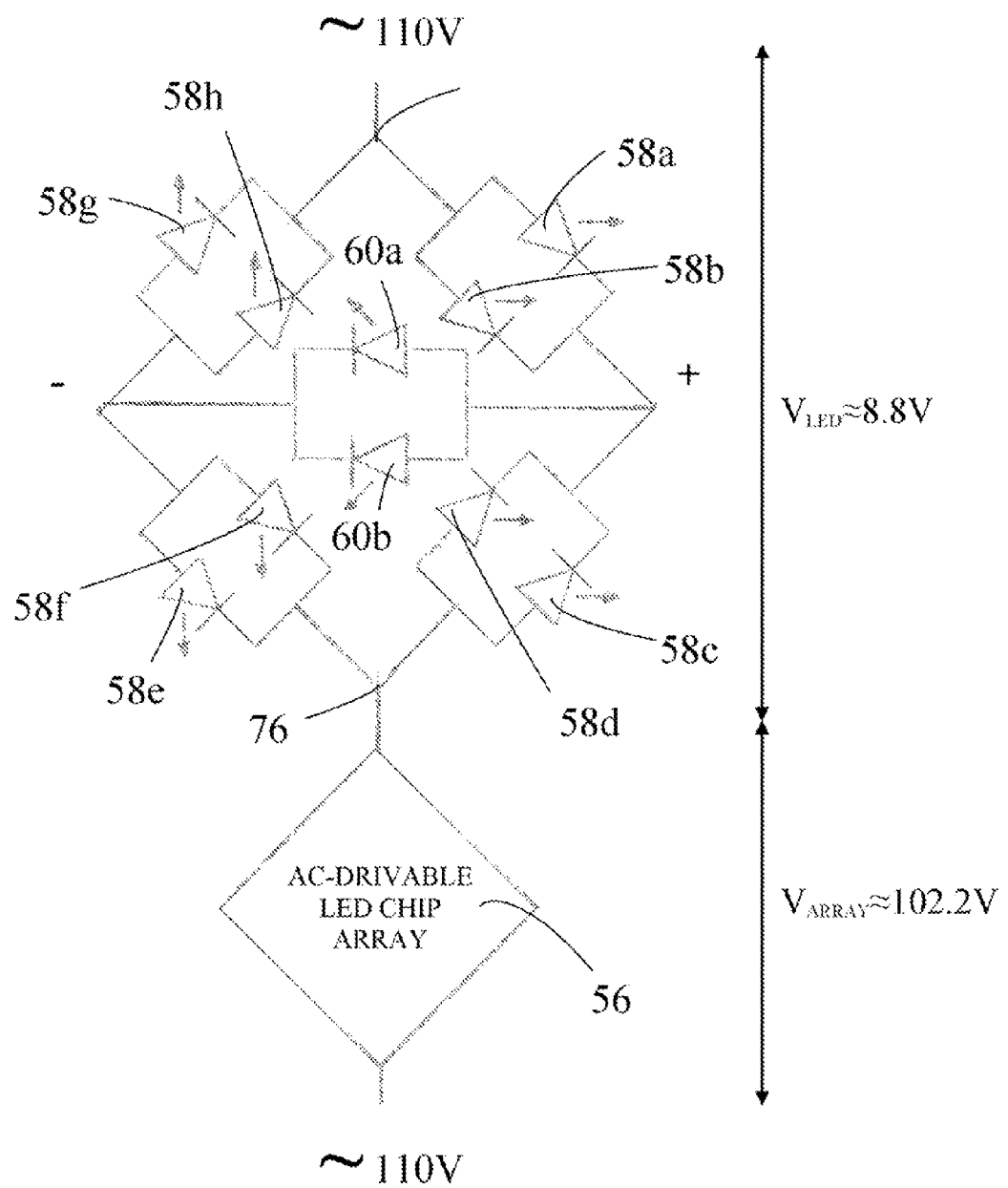

FIG. 17 is a schematic of an equivalent circuit of a light emitting device in accordance with the invention for an LED chip array 56 with an actual drive voltage $V_{ARRAY}$=102.2V. In this arrangement the eight discrete blue LED chips 58a to 58h and two discrete red LEDs 60a, 60b are connected in a full-wave bridge rectifier configuration. Each arm of the bridge comprises two parallel-connected blue LED chips in which the first arm comprises parallel-connected blue LED chips 58a, 58b; the second arm comprises parallel-connected blue LED chips 58c, 58d; the third arm parallel-connected blue LED chips 58e, 58f and the fourth arm parallel-connected blue LED chips 60g, 58h. The two red LED chips 60a, 60b are connected in parallel between the rectifying nodes (+, −) of the bridge circuit. In operation six LED chips (four blue and two red) are operable on each half cycle of drive voltage. On each positive half wave period current flows from a node 74 through the LEDs 58a, 58b, 60a, 60b, 58f, 58e to the node 76. Conversely on negative half wave period current flows from the node 76 through the LEDs 58c, 58d, 60a, 60b, 58g, 58h to the node 74. Assuming a forward voltage drop across each blue LED chip of ≈3.3V and a forward voltage drop across each red LED chip of ≈2.2V the compensation circuit will drop $V_{LED}$≈8.8V (=2×3.3V+2.2V) on each half cycle of drive voltage. In operation the LED chips 58a, 58b, 60a, 60b, 58e, 58f limit the forward drive current of the LED chip array 56 during the positive half wave periods and the LED chips 58c, 58d, 60a, 60b, 58g, 58h limit the drive current during negative half wave periods.

It will be appreciated that in accordance with the invention LED chip arrays with different drive voltages can be operated from the same supply by incorporating different arrangements of discrete LED chips in the device package. While in the foregoing description each of the drive circuits was composed of eight discrete blue LED chips and two red LED chips it is to be appreciated that depending on the drive voltage and the drive voltage of the LED chip array other numbers of discrete LEDs can be used. Moreover the inventive concept can also be applied to DC-drivable devices in which the discrete LED chips are configured in DC-drivable configurations.

Figure 18:
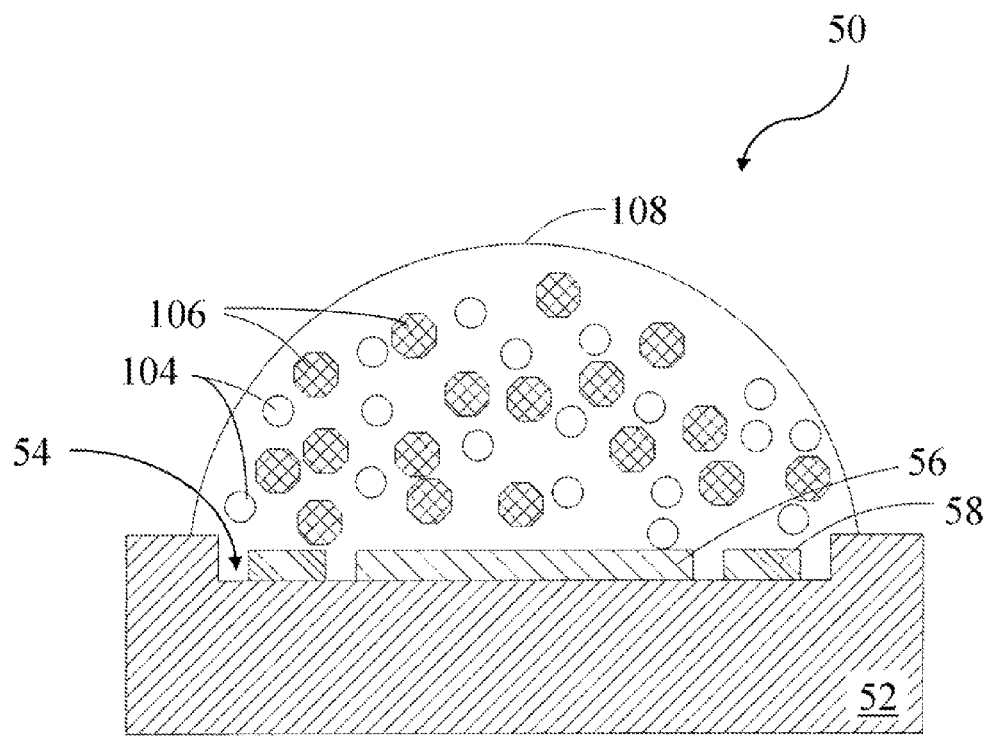
FIG. 18 is a schematic cross-sectional view of an AC-drivable light emitting device in accordance with a further embodiment of the invention.

FIG. 18 is a schematic cross-sectional view of an AC-drivable light emitting device in accordance with a further embodiment of the invention. In this embodiment the AC-drivable LED chip array 56 comprises a GaN device and has a light emission with a peak wavelength in a blue wave band 455 nm to 460 nm whilst the protection LEDs 58 have a light emission with a peak wavelength in a different blue wave band 490 nm-510 nm. When it required that the device generate white light, the device 50 can further comprise one or more phosphor materials such as a green light emitting YAG phosphor 104 and red light emitting silicate-based phosphor 106 that is homogeneously distributed within a light transmissive encapsulation material 108. The encapsulation material 108 typically comprises a silicone or epoxy material and is used to encapsulate the LED chip array 56 and discrete LED chips 58. In operation particles of the YAG phosphor 104 absorb a portion of the blue light (455 nm to 460 nm) emitted by the LED chip array 56 and in response emit green light with a dominant wavelength in a wave band 550 nm to 570 nm. Likewise particles of the silicate-based phosphor 106 absorb a portion of the blue light (490 nm to 510 nm) emitted by the LED chip array 56 and in response emit red light with dominant wavelength in a wave band 620 nm to 650 nm. Light emitted by the device 50, which appears white in color, comprises the combined light from the LED chip array 56 and discrete LED chips 58 (455 nm to 460 nm and 490 nm to 510 nm) that is not absorbed by the phosphor, green light (550 nm to 570 nm) from the first phosphor and red light (620 nm to 650 nm) from the second phosphor. Such white light is found to have a high (>90) color rendering index (CRI). In alternative embodiments, activators in the silicate-based phosphor powder or nitride-based phosphor powder can be adjusted to substitute the YAG phosphor powder 104 or the silicate-based phosphor powder 106 to achieve the effect of the present invention.

The phosphor material, which is typically in powder form, is mixed with a transparent binder material such as a polymer material (for example a thermally or UV curable silicone or an epoxy material) and the polymer/phosphor mixture applied to the light emitting face of each LED chip. As is known the color and/or CCT of the emission product of the LED is determined by the phosphor material composition, quantity of phosphor material etc. The phosphor material(s) required to generate a desired color or CCT of white light can comprise any phosphor material(s) in a powder form and can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 "Europium activated silicate-based green phosphor" (assigned to Internatix Corp.), U.S. Pat. No. 7,601,276 "Two phase silicate-based yellow phosphor" (assigned to Internatix Corp.), U.S. Pat. No. 7,311,858 "Silicate-based yellow-green phosphor" (assigned to Internatix Corp.) and United States patent application publication No. US 2007/0029526 A1 "Silicate-based orange phosphor". The phosphor can also comprise an aluminate-based material such as is taught in our co-pending patent application US2006/0158090 "Aluminate-based green phosphor" and U.S. Pat. No. 7,390,437 "Aluminate-based blue phosphor" (assigned to Internatix Corp.), an aluminum-silicate phosphor as taught in co-pending application US2008/0111472 "Aluminum-silicate orange-red phosphor" or a nitride-based red phosphor material such as is taught in our co-pending United States patent application publication No. US 2009/0283721 A1 "Nitride-based red phosphors" or U.S. patent application Ser. No. 12/632,550 filed Dec. 7, 2009. It will be appreciated that the phosphor material is not limited to the examples described herein and can comprise any phosphor material including nitride and/or sulfate phosphor materials, oxy-nitrides and oxy-sulfate phosphors or garnet materials (YAG).

Figure 19:
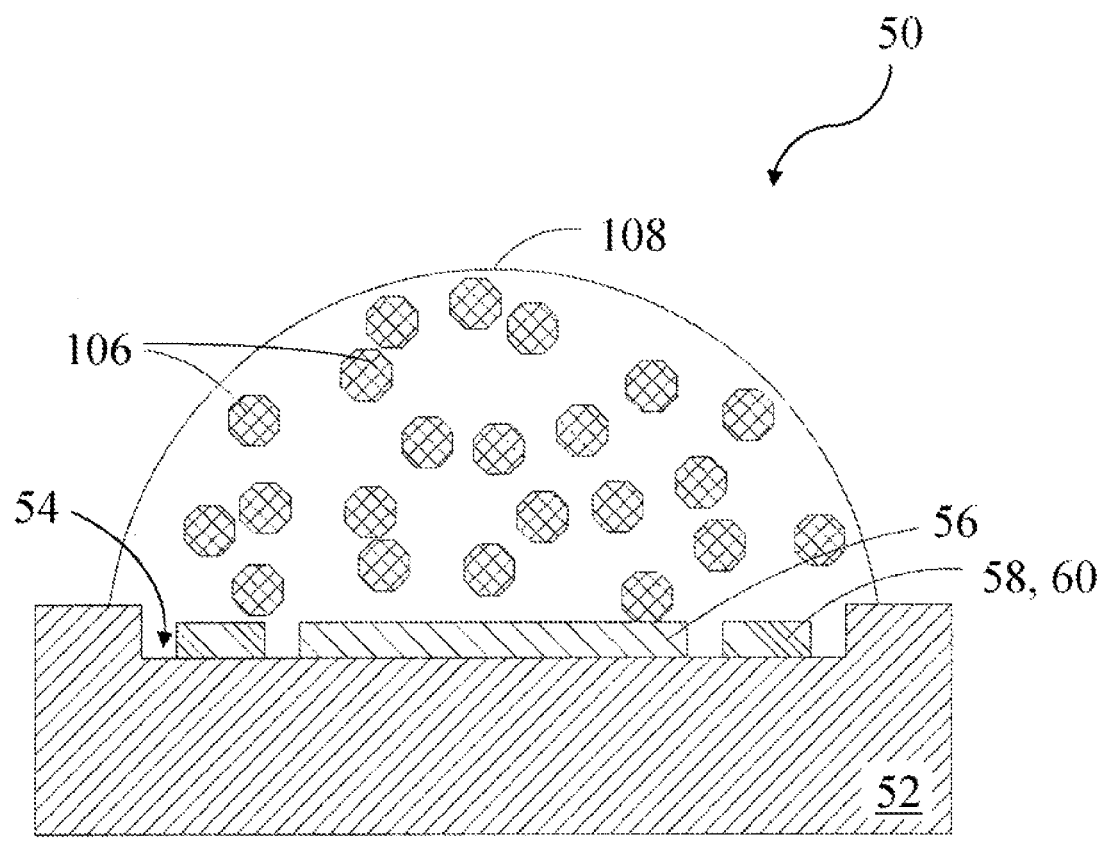
FIG. 19 is a schematic cross-sectional view of an AC-drivable light emitting device in accordance with another embodiment of the invention.

FIG. 19 is a schematic cross-sectional view of a yet further light emitting device in accordance with another embodiment of the invention. In this embodiment the LED chip array 56 comprises a GaN device that has a light emission with a peak wavelength in a blue wave band 455 nm to 460 nm whilst the discrete LED chips 60 are made of an InN-based, GaInAlP-based, GaAlAs-based, GaAlP-based or GaP-based semiconductor material and have a light emission having a peak wavelength in a red wave band 620 nm to 670 nm. As in the embodiment of FIG. 18 the device further comprises a green light emitting phosphor 104, such as a silicate-based phosphor, particles of which are homogeneously distributed within a light transmissive encapsulation material that encapsulates the LED chip array 56 and discrete LED chips 60. In operation the silicate-based phosphor powder 104 absorbs a portion of the blue light emitted by the LED chip array and in response emits a green light with a dominant wavelength in a wave band 550 nm to 570 nm. Light emitted by the device 50, which appears white in color, comprises the combined light from the LED chip array 56 (455 nm to 460 nm) that is not absorbed by the phosphor, green light (550 nm to 570 nm) from the phosphor and red light (620 nm to 650 nm) from the discrete LED chips 60. The device can be configured such that the white light emission has a CRI >90 and preferably >95.

While the invention has been described with reference to specific embodiments, numerous modifications and variations can be made by those skilled in the art without departing from the scope and spirit of the invention set forth in the claims.

What is claimed is:

1. A light emitting device comprising:
an LED chip array comprising a plurality of LEDs formed on a first die, and
at least one discrete LED formed on at least a second die that is separate from the first die having the LED chip array, the at least one discrete LED electrically connected in series with the LED chip array.

2. The device of claim 1, and further comprising a package in which the first die having the LED chip array and the at least second die having at least one discrete LED are mounted.

3. The device of claim 1, wherein the LED chip array is AC-drivable.

4. The device of claim 3, wherein the AC-drivable LED chip array comprises a plurality of LEDs that are configured to be AC-drivable.

5. The device of claim 4, wherein the LEDs are configured such that positive and negative half wave periods of an AC drive are mapped onto oppositely connected LEDs such that oppositely connected LEDs are alternately operable on a respective half wave period.

6. The device of claim 4, wherein the AC-drivable LED chip array comprise at least two LEDs connected in parallel in opposite polarity.

7. The device of claim 4, wherein the LEDs are connected in a bridge configuration.

8. The device of claim 1, wherein the LED chip array and the at least one discrete LED are operable to emit light of substantially a same wavelength.

9. The device of claim 1, wherein the LIED chip array and the at least one discrete LED are operable to emit light of different wavelengths.

10. The device of claim 1, wherein the LED chip array is operable to emit blue light having a peak wavelength in a range 455 to 460 nm.

11. The device of claim 1, wherein the at least one LED is operable to emit blue light having a peak wavelength in a range 490 to 510 nm.

12. The device of claim 1, wherein the at least one LED is operable to emit red light having a peak wavelength in a range 620 to 670 nm.

13. The device of claim 1, further comprising at least one phosphor that is operable to absorb at least a portion of the light emitted by the LED chip array and/or at least one discrete LED and in response emit light having a different dominant wavelength.

14. The device of claim 13, wherein the at least one phosphor is operable to emit green light having a dominant wavelength in a range 550 to 570 nm.

15. The device of claim 14, wherein the at least one phosphor is operable to emit red light having a peak wavelength in a range 620 to 650 nm.

16. The device of claim 13, wherein the at least one phosphor is selected from the group consisting of: YAG material; a silicate material; a nitride material; a sulfate material; an aluminate material; an oxynitride material; an oxysulfate material and a mixture thereof.

17. The device of claim 1, wherein the LED chip array comprises GaN-based LEDs.

18. The device of claim 1, wherein the at least one LED is selected from the group consisting of an InN-based LEDs, a GaInAlP-based LEDs, a GaAlAs-based LEDs, a GaAlP-based LEDs and a GaP-based LEDs.

19. The device of claim 1, wherein the device is drivable from a drive voltage selected from the group consisting of: 40 V, 110V, 220V and 240V.

20. A light emitting device that is drivable from a selected voltage comprising:
an LED chip array comprising a plurality of LEDs formed on a first die and having a nominal drive voltage corresponding to the selected drive voltage and an actual measured drive voltage and
at least one discrete LED formed on at least a second die and electrically connected in series with the LED chip array,
wherein the number of the at least one discrete LED is selected to prevent overdriving of the LED chip array at the selected drive voltage.

21. The device of claim 20, wherein the LED chip array is AC-drivable.

22. The device of claim 21, wherein the AC-drivable LED chip array comprises a plurality of LEDs that are configured to be AC-drivable.

23. The device of claim 22, wherein the LEDs are configured such that positive and negative half wave periods of an AC drive voltage are mapped onto oppositely connected LEDs such that oppositely connected LEDs are alternately operable on a respective half wave period.

24. The device of claim 22, wherein the AC-drivable LED chip array comprises at least two LEDs connected in parallel in opposite polarity.

25. The device of claim 24, wherein the LEDs are connected in a bridge configuration.

26. A light emitting device comprising:
an LED chip array comprising a plurality of LEDs formed on a first die and operable to emit blue light having, a peak wavelength in a range 455 to 460 nm, and
at least one discrete LED formed on at least a second die that is separate from the first die having the LED chip array, and the at least one discrete LED electrically connected in series with the LED chip array and operable to emit red light having a peak wavelength in a range 620 to 670 nm.

27. A light emitting device comprising:
an LED chip array comprising a plurality of LEDs formed on a first die, and
at least one discrete LED formed on at least a second die that is separate from the first die having the LED chip array connected in series with the LED chip array
wherein the device is operable directly from a drive voltage of at least 40 volts.

28. The device of claim 7, wherein the device is operable directly from a drive voltage of at least 110 volts.

29. The device of claim 27, wherein the device is operable directly from a drive voltage of at least 220 volts.

* * * * *